(12) United States Patent
Kulkarni

(10) Patent No.: US 11,558,982 B2
(45) Date of Patent: Jan. 17, 2023

(54) SLIDE RAIL AS AIRFLOW CHANNEL

(71) Applicant: Microsoft Technology Licensing, LLC, Redmond, WA (US)

(72) Inventor: Anand Avinash Kulkarni, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 504 days.

(21) Appl. No.: 16/528,428

(22) Filed: Jul. 31, 2019

(65) Prior Publication Data

US 2020/0383243 A1 Dec. 3, 2020

Related U.S. Application Data

(60) Provisional application No. 62/854,918, filed on May 30, 2019.

(51) Int. Cl.
*H05K 7/20* (2006.01)
*H05K 7/14* (2006.01)

(52) U.S. Cl.
CPC ....... *H05K 7/20736* (2013.01); *H05K 7/1489* (2013.01)

(58) Field of Classification Search
CPC ............. H05K 7/20736; H05K 7/1489; H05K 7/20727
USPC .......................................................... 454/184
See application file for complete search history.

(56) References Cited

U.S. PATENT DOCUMENTS

| | | | | |
|---|---|---|---|---|
| 6,574,100 | B1 * | 6/2003 | Anderson | G06F 1/181 312/236 |
| 2010/0103606 | A1 * | 4/2010 | Olesiewicz | H05K 7/20727 361/679.33 |
| 2011/0267775 | A1 * | 11/2011 | VanDerVeen | H05K 7/20736 361/692 |
| 2014/0009892 | A1 * | 1/2014 | Lin | H05K 7/1489 361/724 |
| 2016/0249479 | A1 | 8/2016 | Kanasaki et al. | |
| 2018/0054923 | A1 * | 2/2018 | Bryan | H01L 23/467 |
| 2018/0260006 | A1 * | 9/2018 | Kurosaki | H05K 7/20181 |

OTHER PUBLICATIONS

"International Search Report and Written Opinion Issued in PCT Application No. PCT/US2020/030578", dated Jul. 27, 2020, 15 Pages.

* cited by examiner

*Primary Examiner* — Steven B McAllister
*Assistant Examiner* — Charles R Brawner
(74) *Attorney, Agent, or Firm* — Alleman Hall Creasman & Tuttle LLP

(57) ABSTRACT

An airflow device includes a cooling air passage structure formed external to and along a side of a server chassis, the cooling air passage structure extending in a depth direction of the server chassis from a front side of the server chassis. The airflow device further includes an airflow channel formed within the cooling air passage structure, the airflow channel extending in the depth direction, and a vent fluidically connecting the airflow channel with an interior of the server chassis at a vent location that is rearward in the depth direction relative to the front side.

6 Claims, 5 Drawing Sheets

SLIDE RAIL AS AIRFLOW CHANNEL

CROSS REFERENCE TO RELATED APPLICATIONS

This application claims priority to U.S. Provisional Patent Application Ser. No. 62/854,918, filed May 30, 2019, the entirety of which is hereby incorporated herein by reference for all purposes.

BACKGROUND

Cooling server components for optimal performance is important for general server function. Temperature control in server racks where heat generation may be high presents a greater challenge. Air may be drawn to the interior of a server that is cooler than air having already circulated within the server. Continually drawing cooler air results in ongoing heat transfer from heat-generating components of the server to the drawn air. Circulated air is then exhausted from the interior to an exterior of the server, thereby cooling interior components. Portions of the server, especially where hard drives, batteries, and other heat-generating components are located may be given special consideration in temperature-control designs for cooling servers.

SUMMARY

An airflow device is provided. The airflow device may include a cooling air passage structure formed external to and along a side of a server chassis, the cooling air passage structure extending in a depth direction of the server chassis from a front side of the server chassis. The airflow device may further include an airflow channel formed within the cooling air passage structure, the airflow channel extending in the depth direction, and a vent fluidically connecting the airflow channel with an interior of the server chassis at a vent location that is rearward in the depth direction relative to the front side.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Disclosed herein is an airflow device to enhance the flow of air to the interior of an electronic device, such as a server. Moving ambient air to the interior of an electronic device for the purpose of cooling heat-generating components within the device may be important to maintaining peak performance of the device. In some prior configurations, baffles were placed within the chassis of a computing device in an attempt to guide air through the chassis of the computing device to specific interior regions that included heat-generating components. However, as the density of components within servers has increased, these densely packed computing device interiors in some situations have been found to impede efficient air flow through the device. For this reason, drawing sufficient air flow through the interior of such a device to various regions in need of cooling has been increasingly difficult to achieve.

Specifically, in some computing device configurations such as blade servers mounted in racks in data center environments, providing sufficient ambient air to the posterior of the device is a challenge. Cooling air may be drawn in at the front of the server by fans mounted at the back of the server; however, intervening components may impede the path of the cooling air flow so that it may not sufficiently reach posterior regions of the device. Additionally, the air that has been drawn into the device may become too hot while circulating, hindering reliable device operation. Since power supply units and hard drives are often placed near posterior regions of the device, maintaining cooler airflow to thus provide sufficient cooling for these components at the back of a device may be important. To address these issues, an example configuration of an airflow device is disclosed herein that utilizes an additional one or more channels for airflow that are provided external to the chassis of the computing device. These channels may guide airflow through slide rails of the chassis to regions internal to the chassis, thereby augmenting cooling airflow to rearward regions within the chassis.

Figure 1:
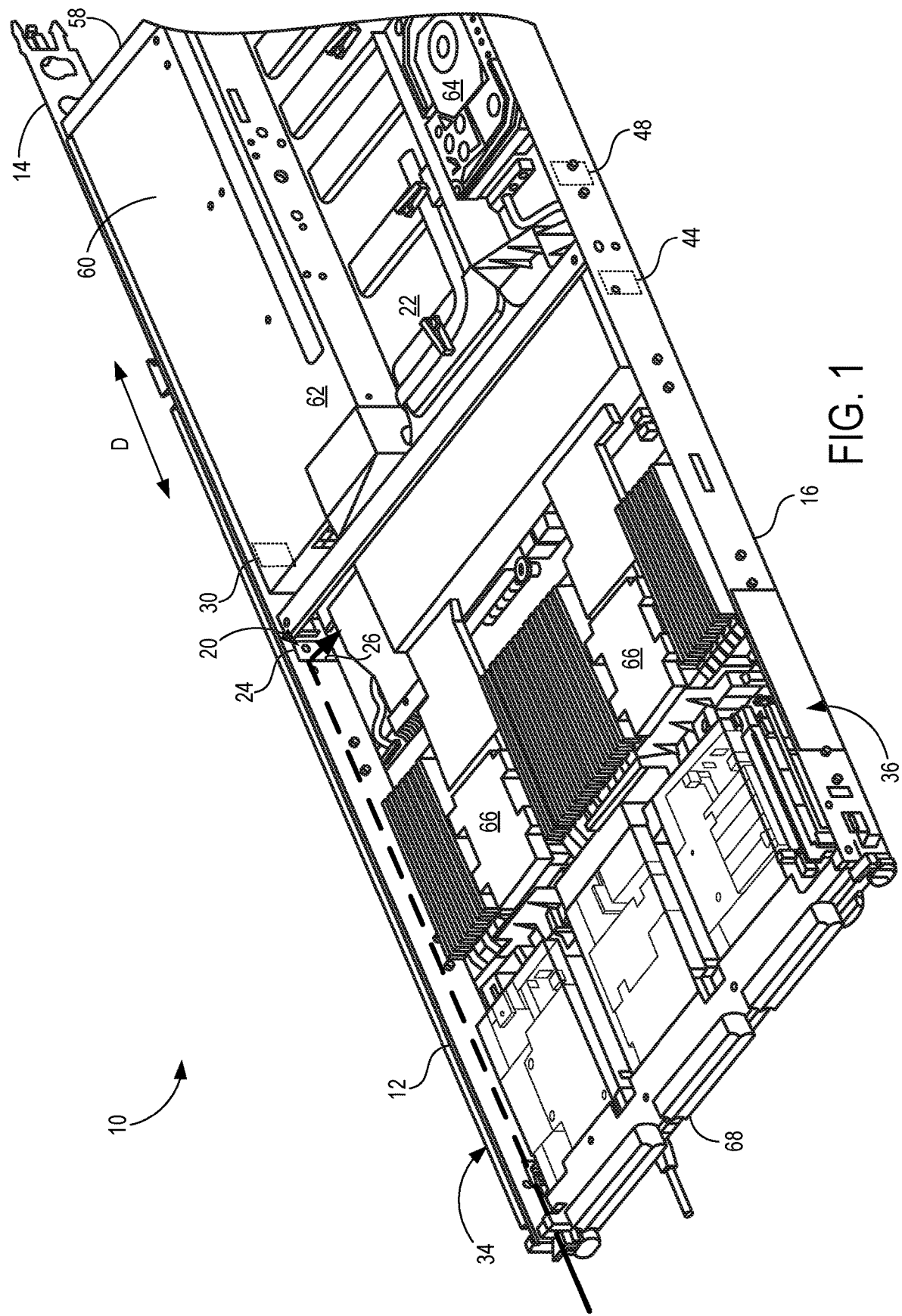
FIG. 1 shows a schematic view of an example hardware environment in which an airflow device may be implemented.

FIG. 1 shows a schematic view of an example hardware environment including an electronic device 10 on which the airflow device 12 may be implemented. In this example configuration, electronic device 10 is a blade server that includes the airflow device 12. The blade server may include a power supply unit (PSU) 60, batteries 62, a hard drive 64, and processors 66, among other components. These and other components may generate heat while in operation, thus designs that admit cooler air into the interior of the blade server may be advantageous. PSU fans 70 and system fans 54 may be placed toward the back of the electronic device 10 to assist in drawing air from the front side 68 to the back side 58 of the electronic device 10 (shown in FIG. 4). A slide rail that is a first slide rail 14 of a server chassis 16 may be external to and along a side that is a first side 34 of the server chassis 16. The slide rails of the server chassis 16 may allow for placement of the blade server in a server rack (not shown). The airflow device 12 may include a cooling air passage structure formed external to and along the side of the server chassis 16. The cooling air passage structure may extend in a depth direction D of the server chassis 16 from the front side 68 of the server chassis 16. In FIG. 1, an example airflow is indicated by an arrow from a front side 68 of the electronic device 10 to a first vent 20; the arrow is dashed where indicating airflow within the cooling air passage structure of the airflow device 12. In the examples discussed below, the cooling air passage structure may be the first slide rail 14 of the server chassis 16.

Figure 2:
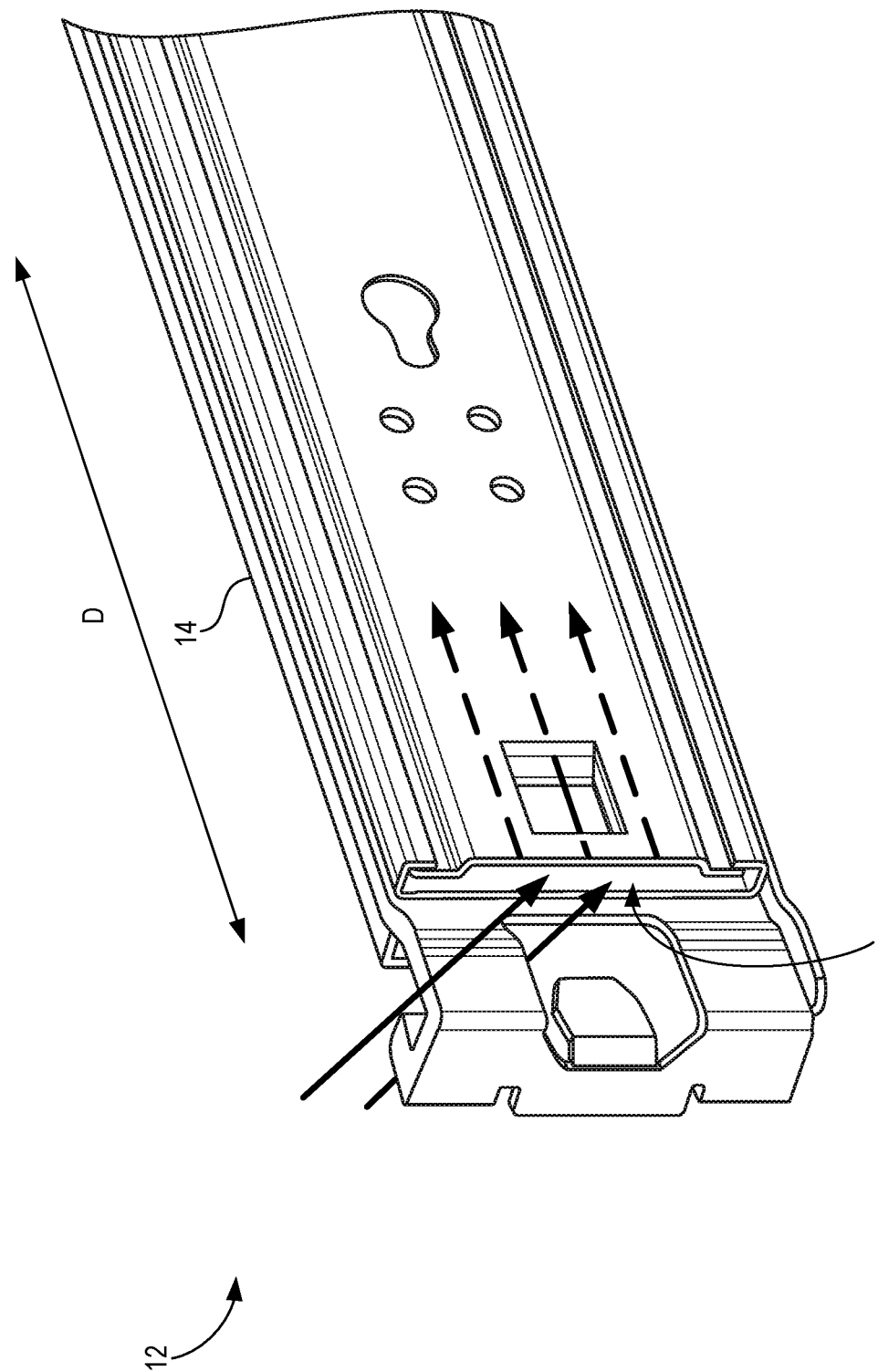
FIG. 2 is a magnified view of a portion of the airflow device that may be implemented in the electronic device of FIG. 1 according to one example embodiment.

FIG. 2 is a magnified view of a portion of the airflow device that may be implemented in the electronic device 10. An airflow channel may be formed within the cooling air passage structure, which may be referred to as a first airflow channel 18. The first airflow channel 18 may be in the first slide rail 14 and extend along a depth direction D of the server chassis 16. As shown in FIG. 2, it will be appreciated that the first airflow channel 18 may be integral with the first slide rail 14 and external to the interior 22 of the server chassis 16. As also shown in FIG. 2, two arrows indicate a flow of air that may enter an opening of the first airflow channel 18 and a set of three parallel arrows indicates the direction of airflow though the first airflow channel 18, the set of three parallel arrows being dashed where airflow is indicated to be internal to the first airflow channel 18. One potential advantage of locating the first airflow channel 18 exterior to the server chassis 16 is that air may not be preheated before being directed to the near-vicinity of a heat-generating component, unlike air that is exclusively drawn from the front side 68 of the electronic device 12 and guided to the back side 58 through the server chassis 16.

Figure 3:
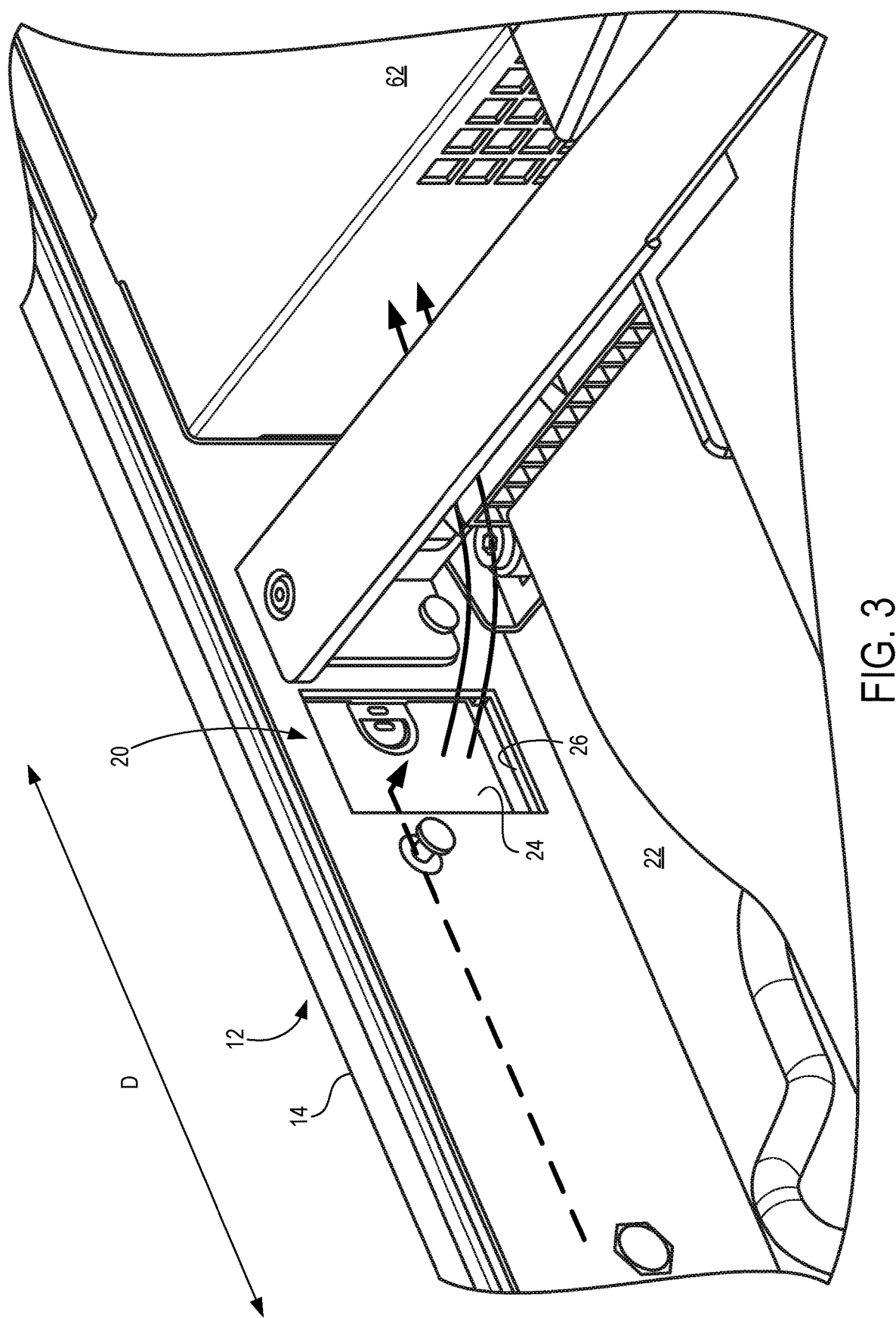
FIG. 3 is a detailed view of a section of the interior of the electronic device of FIG. 1 including the airflow device according to one example embodiment.

FIG. 3 is a magnified view of a portion of the airflow device 12 showing a depth direction D along the first side 34 of the server chassis 16 that is further to the posterior of the server chassis 16 than the view shown in FIG. 2. As shown in FIG. 3, a vent, which may be understood as a first vent 20, may fluidically connect the first airflow channel 18 with the interior 22 of the server chassis 16 at a vent location that is rearward in the depth direction D relative to the front side 68. A dashed line with an arrow tip indicates an example airflow direction along the inside of airflow device 12 to the first vent 20. The first vent 20 may include a channel opening, which may be referred to as a first channel opening 24 that may be at a first depth 28 of the server chassis 16, in the first airflow channel 18. The first vent 20 may also include a chassis opening, which may be referred to as a first chassis opening 26, in the server chassis 16. The first chassis opening 26 may be coincident with the first channel opening 24 such that air flows from the first airflow channel 18 through the first channel opening 24 and through the first chassis opening 26 into the interior 22 of the server chassis 16. Two parallel arrows in FIG. 3 indicate an example airflow from the vent 20 at the coincident openings toward a posterior of the electronic device 10 along the depth direction D. As shown in FIG. 3, the airflow may not be introduced to the interior 22 of the server chassis 16 until the air reaches a location proximate a component to be cooled, which in this case includes the batteries 62. In this example, a potential advantage of the configuration is that the airflow internal to the electronic device 10 need not travel very far within the interior 22 before reaching the batteries 62 to be cooled.

Figure 4:
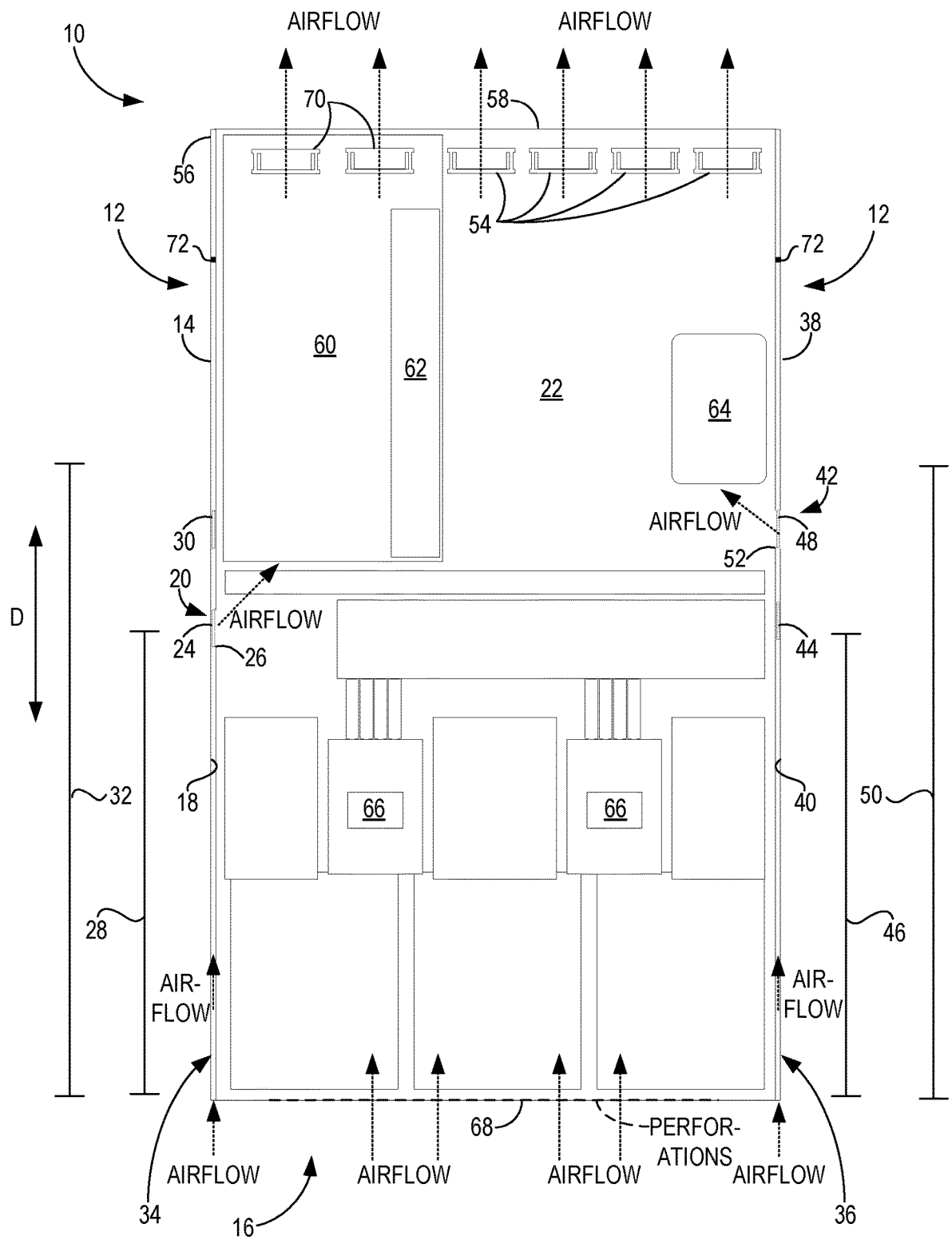
FIG. 4 is a top view of the electronic device of FIG. 1 including the airflow device according to one example embodiment.

FIG. 4 is a top view of the electronic device 10. As shown in FIG. 4, the airflow device 12 may further include a second channel opening 30 in the first airflow channel 18 at a second depth 32 of the server chassis 16. However, although the second channel opening 30 may be present in the first airflow channel 18, an accompanying chassis opening may not be placed in the server chassis 16. As further discussed below, this design may facilitate a preferred airflow from the first airflow channel 18 to the interior 22 of the server chassis 16 while allowing for ease of manufacture of the first and second slide rails 14, 38, since the same component shape may be used for each of a first and second slide rails 14, 38, thereby reducing the unique part count.

Given the symmetry of the server blade as shown in FIG. 4, it will be appreciated that the airflow device 12 may further include a second slide rail 38 of the server chassis 16 external to and along a second side 36 of the server chassis 16. A second airflow channel 40 that may be in the second slide rail 38 may extend along the depth direction D of the server chassis 16. The airflow device 12 may further include a third channel opening 44 at a third depth 46 and a fourth channel opening 48 at a fourth depth 50 in the second airflow channel 40. Although as shown in FIG. 4 the first depth 28 is depicted as equal to third depth 46 and the second depth 32 is depicted as equal to the fourth depth 50, it will be appreciated that each depth of the respective channel openings may differ in some embodiments, and any particular depth placement of a given channel opening may not be equal to any other depth placement of another given channel opening.

As shown in FIG. 4, a second vent 42 may fluidically connect the second airflow channel 40 with the interior 22 of the server chassis 16. The second vent 42 may include the fourth channel opening 48 and a second chassis opening 52 in the server chassis 16. The second chassis opening 52 may be coincident with the fourth channel opening 48 such that air flows from the second airflow channel 40 through the fourth channel opening 48 and through the second chassis opening 52 into the interior 22 of the server chassis 16.

The first depth 28 where the first chassis opening 26 may be coincident with the first channel opening 24 in the first airflow channel 18 may be a different depth than the fourth depth 50 where the second chassis opening 52 may be coincident with the fourth channel opening 48 in the second airflow channel 40. An example of this configuration is shown in FIG. 4, where first channel opening 24 aligns with first chassis opening 26 to create first vent 20, while second channel opening 30 does not align with a chassis opening and therefore admits no airflow into the interior of electronic device 10. Therefore, air drawn into the first airflow channel 18 may be directed exclusively toward the back of the blade server to cool the PSU 60 and in particular the PSU batteries 62. However, on the second side 36, the third channel opening 44 does not align with a chassis opening, while the fourth channel opening 48 is coincident with the second chassis opening 52 to create the second vent 42. Airflow at the second vent 42 may be directed primarily to the hard drive 64. As shown, therefore, the first depth 28 is a different depth than the fourth depth 50 to selectively guide air to preferred locations in the interior 22 of the server chassis 16. Therefore, airflow may be intentionally directed through the interior 22 of the server chassis 16. However, the first and second slide rails 14, 38 may have channel openings at the same depths along each of the slide rails, and thus the slide rails may be manufactured more easily because of this symmetry.

In an alternative configuration, a first plurality of channel openings may be formed in the first airflow channel 18 and a second plurality of channel openings may be formed in the second airflow channel 40. Each one of the first plurality of channel openings may be at a different depth along the depth direction D and each one of the second plurality of channel openings may be at a same depth along the depth direction D as each of the first plurality of channel openings. In this configuration, each channel opening may be spaced from any other channel opening by a preferred amount, regularly or irregularly. However, by forming the second plurality of channel openings each at a same depth as the first plurality of channel openings the first and second slide rails 14, 38 may match such that they be manufactured similarly and thus potentially more efficiently as discussed above.

Continuing in this example, one or more chassis openings in the server chassis 16 may be along a first side 34 and/or a second side 36 of the server chassis 16. At least one vent may be formed to include one of the first and second plurality of channel openings coincident with one of the one or more chassis openings. In this configuration any one or more chassis openings may be formed to align with any of the channel openings to selectively form and place one or more vents along the first and second sides 34, 36 of the server chassis 16. Each vent may fluidically connect the at least one of the first airflow channel 18 and second airflow channel 40 with an interior 22 of the server chassis 16 at a vent location that is rearward in the depth direction D relative to the front side 68. A potential advantage of this configuration is that vents may be placed strategically along the server chassis 16 efficiently by designing the first and second slides rails 14, 38 with channel openings at set, predetermined locations to which chassis openings may be selectively matched.

It will be appreciated that this selective alignment of the channel openings with the chassis openings may allow for intentional placement of the vents to potentially bring relatively fresh air to the components of the interior of electronic device 10, particularly to the posterior of the device 10. It will be further appreciated that while the placement of each channel opening in the slide rails may be the same to facilitate manufacturing of the slide rails, placement of the chassis openings to create selectively-placed vents may ultimately determine the location of airflow from the respective airflow channels into the interior 22 of the server chassis 16. Alternatively, it will be further appreciated that the placement of channel openings in the slide rails may be at different depths for each slide rail so that the channel openings are not symmetric along each of the slide rails. An asymmetrical design may be advantageous in some applications for vent and airflow design.

The back side 56 of the first airflow channel 18 may be blocked by a restrictor 72 included at a posterior end of the first airflow channel 18 such that heated air from a back side 58 of the server chassis 16 may be prevented from entering the first airflow channel 18. This configuration may be advantageous when heat-generating components such as the PSU 60 are located near the back of the blade server and cause the air surrounding this region to be warmer than the ambient air. Blocking the back side 56 of the first airflow channel 18 (or second airflow channel 40) may prevent this warmer air from entering the respective airflow channels.

Figure 5:
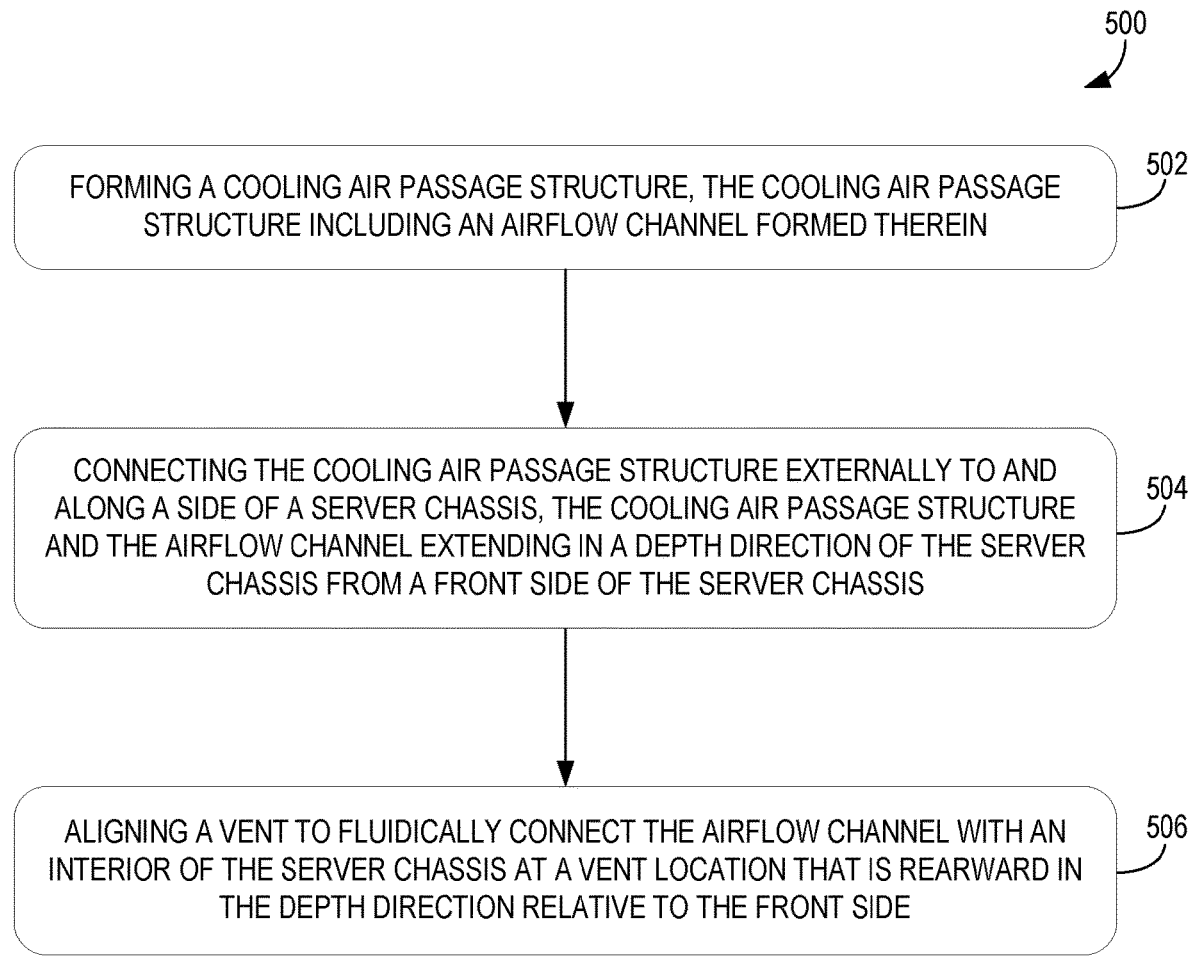
FIG. 5 is a flowchart of a method according to one implementation of the present disclosure.

FIG. 5 shows a flowchart of a method 500 for manufacturing an airflow device 12. The following description of method 500 is provided with reference to the airflow device 12 described above and shown in the electronic device 10 of FIG. 1. It will be appreciated that method 500 may also be performed in other contexts using other suitable components.

With reference to FIG. 5, the method 500 for manufacturing an airflow device 12 at 502 may include forming a cooling air passage structure, the cooling air passage structure including an airflow channel that may be a first airflow channel 18 formed therein. At 504 the method 500 may include connecting the cooling air passage structure externally to and along a side that may be a first side 34 of a server chassis 16, the cooling air passage structure and the first airflow channel 18 extending in a depth direction D of the server chassis 16 from a front side 68 of the server chassis 15. The method 500 at 506 may include aligning a vent that may be a first vent 20 to fluidically connect the first airflow channel 18 with an interior 22 of the server chassis 16 at a vent location that is rearward in the depth direction D relative to the front side 68. A potential advantage of this configuration is that, by having the cooling air passage external to the server chassis 16, air drawn from outside the server that moves along the first side 34 of the server chassis 16 may not absorb a significant amount of heat before entering the interior 22 of the server at the first vent 20. Thus, when the air finally moves through the first vent 20, it may have a greater cooling impact on heat-generating components near the first vent 20 compared to air entering at the front side 68 of the server that may have to travel within the server where the air may be warmer than ambient air to the heat-generating components near the first vent 20.

As described above, the cooling air passage structure may be a slide rail that may be a first slide rail 14 of the server chassis 16. The method 500 may further include forming a channel opening that may be a first channel opening 24 in the first airflow channel 18 and forming a chassis opening that may be a first chassis opening 26 in the server chassis 16. Aligning the first vent 20 may include aligning the first channel opening 24 in the airflow channel 18 with the first chassis opening 26. The first chassis opening 26 may be coincident with the first channel opening 24 such that air flows from the first airflow channel 18 through the first channel opening 24 and through the first chassis opening 26 into the interior 22 of the server chassis 16. As described above, the channel opening may be a first channel opening 24. The first channel opening 24 may be at a first depth 28 of the server chassis 16. The method 500 may further include forming a second channel opening 30 in the first airflow channel 18 at a second depth 32 of the server chassis 16. It will be appreciated that the placement of first and second channel openings 24, 30 along the first airflow channel 18 may be according to a preferred design that may reflect the placement of components and/or a planned airflow within the server.

As described above, the slide rail may be a first slide rail 14, the side of the server chassis 16 may be a first side 34, the airflow channel may be a first airflow channel 18, and the vent may be a first vent 20. The method 500 may include connecting a second slide rail 38 of the server chassis 16 external to and along a second side 36 of the server chassis 16. The method 500 may further include forming a second airflow channel 40 that may be formed in the second slide rail 38 and that extends along the depth direction D of the server chassis 16. The method 500 may also include aligning a second vent 42 to fluidically connect the second airflow channel 40 with the interior 22 of the server chassis 16. It will be appreciated that the first and second slide rails 14, 38 may be manufactured with symmetry in mind, the first and second airflow channels 18, 40 formed similarly within each respective slide rail. The channel openings may also be symmetric with respect to the first and second sides 34, 36; however, the first and second vents 20, 42 may not symmetrically align. This design may have potential advantages as further explained below.

The method 500 may include forming a third channel opening 44 at a third depth 46 in the second airflow channel 40 and forming a fourth channel opening 48 at a fourth depth 50 in the second airflow channel 40. As described above, the chassis opening may be a first chassis opening 26. The method 500 may include forming a second chassis opening 52 in the server chassis 16. Aligning the second vent 42 may include aligning the fourth channel opening 48 and the second chassis opening 52 in the server chassis 16, the second chassis opening 16 coincident with the fourth channel opening 48 such that air flows from the second airflow channel 40 through the fourth channel opening 48 and through the second chassis opening 52 into the interior 22 of the server chassis 16.

It will be appreciated that the first and second vents 20, 42 may be at different depths along the first and second sides 34, 36 of the server. That is, the first depth 28 where the first chassis opening 26 is coincident with the first channel opening 24 in the first airflow channel 18 may be a different depth than the fourth depth 50 where the second chassis opening 52 is coincident with the fourth channel opening 48 in the second airflow channel 40. In this manner, while the channel openings may be placed at the same depths respective to the first and second sides 34, 36 of the first and second slide rails 14, 38 to potentially simplify the manufacturing of the slide rails, the chassis openings may be at different depths to align selectively with the channel openings. Thus, airflow may be directed as specific to each of the first and second sides 34, 36 of the server.

As described above, a restrictor 72 may be included at a posterior end of the first airflow channel 18 such that air from a back side 58 of the server chassis 16 may be prevented from entering the first airflow channel 18. As heat-generating components may be located near the back of the server, the air surrounding the server posterior may be elevated in temperature compared to ambient air farther away from the back of the server. As such, placing a restrictor 72 near the back of the first and second airflow channels 18, 40 may be advantageous to maintaining airflow from the front side 68 of the server toward the back rather than airflow in from the back side 58.

As described herein, the airflow device 12 may be implemented in an electronic device 10 to potentially draw ambient air from external the electronic device 10 to an interior region. Being external to the electronic device 10, the airflow device 12 may not consume space interior to the electronic device 10, thus allowing room for other components and/or allowing increased space for airflow within the electronic device 10. Also, air flowing through the airflow channels may avoid being unnecessarily heated by heat generating components during its travel exterior to the chassis. Placement of the channel openings and chassis openings to create the vents at selected positions may accommodate ease of manufacture and specificity of directed airflow, particularly to regions at the posterior of the chassis.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

The following paragraphs provide additional support for the claims of the subject application. One aspect provides an airflow device comprising a cooling air passage structure formed external to and along a side of a server chassis, the cooling air passage structure extending in a depth direction of the server chassis from a front side of the server chassis. The airflow device includes an airflow channel formed within the cooling air passage structure, the airflow channel extending in the depth direction. The airflow device includes a vent fluidically connecting the airflow channel with an interior of the server chassis at a vent location that is rearward in the depth direction relative to the front side.

In this aspect, additionally or alternatively, the cooling air passage structure may be a slide rail of the server chassis. In this aspect, additionally or alternatively, the vent may include a channel opening in the airflow channel and a chassis opening in the server chassis. In this aspect, additionally or alternatively, the chassis opening may be coincident with the channel opening such that air may flow from the airflow channel through the channel opening and through the chassis opening into the interior of the server chassis. In this aspect, additionally or alternatively, the channel opening may be a first channel opening at a first depth of the server chassis, and the airflow device may further include a second channel opening in the airflow channel at a second depth of the server chassis.

In this aspect, additionally or alternatively, the slide rail may be a first slide rail, the side of the server chassis may be a first side, the airflow channel may be a first airflow channel, and the vent may be a first vent. The airflow device may further include a second slide rail of the server chassis external to and along a second side of the server chassis; a second airflow channel that may be in the second slide rail extending along the depth direction of the server chassis; and a second vent to fluidically connect the second airflow channel with the interior of the server chassis.

In this aspect, additionally or alternatively, the airflow device may further include a third channel opening at a third depth and a fourth channel opening at a fourth depth in the second airflow channel. In this aspect, additionally or alternatively, the chassis opening may be a first chassis opening and the second vent may include the fourth channel opening and a second chassis opening in the server chassis. The second chassis opening may be coincident with the fourth channel opening such that air may flow from the second airflow channel through the fourth channel opening and through the second chassis opening into the interior of the server chassis. In this aspect, additionally or alternatively, the first depth where the first chassis opening may be coincident with the first channel opening in the first airflow channel may be a different depth than the fourth depth where the second chassis opening is coincident with the fourth channel opening in the second airflow channel.

Another aspect provides a method for manufacturing an airflow device. The method comprises forming a cooling air passage structure, the cooling air passage structure including an airflow channel formed therein. The method further comprises connecting the cooling air passage structure externally to and along a side of a server chassis, the cooling air passage structure and the airflow channel extending in a depth direction of the server chassis from a front side of the server chassis. The method further comprises aligning a vent to fluidically connect the airflow channel with an interior of the server chassis at a vent location that is rearward in the depth direction relative to the front side.

In this aspect, additionally or alternatively, the cooling air passage structure may be a slide rail of the server chassis. In this aspect, additionally or alternatively, the method may further comprise forming a channel opening in the airflow channel and forming a chassis opening in the server chassis; aligning the vent may include aligning the channel opening in the airflow channel with the chassis opening in the server chassis. In this aspect, additionally or alternatively, the chassis opening may be coincident with the channel opening such that air may flow from the airflow channel though the channel opening and through the chassis opening into the interior of the server chassis. In this aspect, additionally or alternatively, the channel opening may be a first channel opening at a first depth of the server chassis, and the method may further comprise forming a second channel opening in the airflow channel at a second depth of the server chassis.

In this aspect, additionally or alternatively, the slide rail may be a first slide rail, the side of the server chassis may be a first side, the airflow channel may be a first airflow channel, and the vent may be a first vent. The method may further comprise connecting a second slide rail of the server chassis external to and along a second side of the server chassis; forming a second airflow channel that may be formed in the second slide rail and that extends along the depth direction of the server chassis; and aligning a second vent to fluidically connect the second airflow channel with the interior of the server chassis.

In this aspect, additionally or alternatively, the method may further comprise forming a third channel opening at a third depth in the second airflow channel and forming a fourth channel opening at a fourth depth in the second airflow channel. In this aspect, additionally or alternatively, the chassis opening may be a first chassis opening, and the method may further comprise forming a second chassis opening in the server chassis. Aligning the second vent may include aligning the fourth channel opening and the second chassis opening in the server chassis, the second chassis opening coincident with the fourth channel opening such that air may flow from the second airflow channel through the fourth channel opening and through the second chassis opening into the interior of the server chassis. In this aspect, additionally or alternatively, the first depth where the first chassis opening may be coincident with the first channel opening in the first airflow channel may be a different depth than the fourth depth where the second chassis opening may be coincident with the fourth channel opening in the second airflow channel.

Another aspect provides an airflow device comprising a first cooling air passage structure that is a first slide rail of a server chassis formed external to and along a first side of the server chassis, the cooling air passage structure extending in a depth direction of the server chassis from a front side of the server chassis. The airflow device includes a second cooling air passage structure that is a second slide rail of the server chassis formed external to and along a second side of the server chassis, the second cooling air passage extending in the depth direction of the server chassis from the front side of the server chassis. The airflow device includes a first airflow channel formed within the first cooling air passage structure and a second airflow channel formed within the second cooling air passage structure, the first and second airflow channels extending in the depth direction. The airflow device includes a first plurality of channel openings in the first airflow channel and a second plurality of channel openings in the second airflow channel, each one of the first plurality of channel openings at a different depth along the depth direction and each one of the second plurality of channel openings at a same depth along the depth direction as each of the first plurality of channel openings. The airflow device includes one or more chassis openings in the server chassis along a first side and/or second side of the server chassis and at least one vent including one of the first and second plurality of channel openings coincident with one of the one or more chassis openings to fluidically connect at least one of the first and second airflow channels with an interior of the server chassis at a vent location that is rearward in the depth direction relative to the front side.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed. If used herein, a phrase of the form "at least one of A and B" means at least one A or at least one B, without being mutually exclusive of each other, and does not require at least one A and at least one B. If used herein, the phrase "and/or" means any or all of multiple stated possibilities.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An airflow device, comprising:
a first cooling air passage structure formed external to an interior of a server chassis and along a first side of the server chassis, the first cooling air passage structure extending in a depth direction of the server chassis form a front side of the server chassis, the first cooling air passage structure including a first slide rail of the server chassis;
a first airflow channel opening and a second airflow channel opening formed within the first cooling air passage structure, the first and second airflow channel openings arranged at respective first and second depths of the server chassis in the depth direction;
a second cooling air passage structure formed external to the interior of the server chassis and along a second side of the server chassis, the second cooling air passage structure including a second slide rail of the server chassis; and
a third airflow channel opening and a fourth airflow channel opening formed within the second cooling air passage structure, the third and fourth airflow channel openings arranged at respective third and fourth depths of the server chassis in the depth direction, wherein
the first airflow channel opening is coincident with a first chassis opening at the first depth of the server chassis,
the fourth airflow channel opening is coincident with a second chassis opening at the fourth depth of the server chassis, and the first depth of the server chassis is arranged anterior to the fourth depth of the server chassis.

2. The airflow device of claim 1, wherein a first restrictor is included at a posterior end of the first cooling air passage structure, and a second restrictor is included at a posterior end of the second cooling air passage structure such that air from a back side of the server chassis is prevented from entering the first and second cooling air passage structures.

3. A method for manufacturing an airflow device, the method comprising:
forming a first cooling air passage structure, the first cooling air passage structure including a first slide rail of a server chassis and a first airflow channel opening and a second airflow channel opening formed therein;
connecting the first cooling air passage structure externally to an interior of the server chassis and along a first side of the server chassis, the first cooling air passage structure extending in a depth direction of the server chassis from a front side of the server chassis, and the first and second airflow channel openings arranged at respective first and second depths of the server chassis in the depth direction of the server chassis;
forming a second cooling air passage structure, the second cooling air passage structure including a second slide rail of the server chassis and a third airflow channel opening and a fourth airflow channel opening formed therein;

connecting the second cooling air passage structure externally to the interior of the server chassis and along a second side of the server chassis, the second cooling air passage structure extending in the depth direction of the server chassis, and the third and fourth airflow channel openings arranged at respective third and fourth depths of the server chassis in the depth direction of the server chassis, wherein the first airflow channel opening is coincident with a first chassis opening at the first depth of the server chassis, the fourth airflow channel opening is coincident with a second chassis opening at the fourth depth of the server chassis, and the first depth of the server chassis is arranged anterior to the fourth depth of the server chassis.

4. The method of claim 3, the method further comprising:
forming a first restrictor at a posterior end of the first cooling air passage structure; and
forming a second restrictor at a posterior end of the second cooling air passage structure.

5. An airflow device, comprising:
a first cooling air passage structure that includes a first slide rail of a server chassis formed external to an interior of the server chassis and along a first side of the server chassis, the cooling air passage structure extending in a depth direction of the server chassis from a front side of the server chassis;
a second cooling air passage structure that includes a second slide rail of the server chassis formed external to an interior of a server chassis and along a second side of the server chassis, the second cooling air passage extending in the depth direction of the server chassis from the front side of the server chassis;
a first airflow channel formed within the first cooling air passage structure and a second airflow channel formed within the second cooling air passage structure, the first and second airflow channels extending in the depth direction;
a first plurality of channel openings in the first airflow channel and a second plurality of channel openings in the second airflow channel, each one of the first plurality of channel openings at a different depth along the depth direction and each one of the second plurality of channel openings at a same depth along the depth direction as each of the first plurality of channel openings;
one or more chassis openings in the server chassis along the first side of the server chassis;
one or more chassis openings in the server chassis along the second side of the server chassis;
a first vent including one of the first plurality of channel openings coincident with one of the one or more chassis openings along the first side of the server chassis to fluidically connect at least one of the first airflow channels with an interior of the server chassis at a first vent location that is rearward in the depth direction relative to the front side; and
a second vent including one of the second plurality of channel openings coincident with one of the one or more chassis openings along the second side of the server chassis to fluidically connect at least one of the second airflow channels with the interior of the server chassis at a second vent location that is rearward in the depth direction relative to the first vent location.

6. The airflow device of claim 5, further comprising:
a first restrictor at a posterior end of the first cooling air passage structure, and a second restrictor at a posterior end of the second cooling air passage structure, such that air from a back side of the server chassis is prevented from entering the respective first and second cooling air passage structures.

* * * * *